United States Patent
Jeong et al.

(10) Patent No.: US 10,910,237 B2
(45) Date of Patent: Feb. 2, 2021

(54) OPERATING METHOD FOR WET ETCHING SYSTEM AND RELATED SYSTEM

(71) Applicant: SAMSUNG ELECTRONICS CO., LTD., Suwon-si (KR)

(72) Inventors: Sang Hoon Jeong, Hwaseong-si (KR); Yong Sun Ko, Hwaseong-si (KR); Dong Ha Kim, Hwaseong-si (KR); Tae Heon Kim, Hwaseong-si (KR); Chang Sup Mun, Hwaseong-si (KR); Woo Gwan Shim, Hwaseong-si (KR); Jun Youl Yang, Hwaseong-si (KR); Se Ho Cha, Hwaseong-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 0 days.

(21) Appl. No.: 16/502,450

(22) Filed: Jul. 3, 2019

(65) Prior Publication Data
US 2020/0203195 A1 Jun. 25, 2020

(30) Foreign Application Priority Data
Dec. 21, 2018 (KR) .......................... 10-2018-0166873

(51) Int. Cl.
*H01L 21/67* (2006.01)
*H01L 21/311* (2006.01)

(52) U.S. Cl.
CPC .. *H01L 21/67086* (2013.01); *H01L 21/31111* (2013.01); *H01L 21/67098* (2013.01)

(58) Field of Classification Search
CPC ......... H01L 21/67086; H01L 21/31111; H01L 21/67098; H01L 21/67017; H01L 21/67075; H01L 21/67051
(Continued)

(56) References Cited

U.S. PATENT DOCUMENTS 6,780,277 B2 8/2004 Yokomizo et al.
8,282,766 B2 10/2012 Eilmsteiner et al.
(Continued)

FOREIGN PATENT DOCUMENTS

JP 2014-072505 A 4/2014
KR 10-2001-0077385 A 8/2001
(Continued)

*Primary Examiner* — Lan Vinh
(74) *Attorney, Agent, or Firm* — Lee IP Law, P.C.

(57) ABSTRACT

A wet etching system operating method includes providing an etching apparatus having an $N^{th}$ etching solution, loading $N^{th}$ batch substrates into the etching apparatus and performing an $N^{th}$ etching process, discharging some of the $N^{th}$ etching solution, refilling the etching apparatus with an $(N+1)^{th}$ etching solution supplied from a supply apparatus connected to the etching apparatus, and loading $(N+1)^{th}$ batch substrates into the etching apparatus and performing an $(N+1)^{th}$ etching process, wherein the $(N+1)^{th}$ etching solution has a temperature within or higher than a temperature management range of the $(N+1)^{th}$ etching process, and wherein the $(N+1)^{th}$ etching solution has a concentration within or higher than a concentration management range of the $(N+1)^{th}$ etching solution, N being a positive integer.

20 Claims, 8 Drawing Sheets

(58) Field of Classification Search
USPC ............... 438/745, 750; 156/345.14, 345.15,
156/345.18
See application file for complete search history.

(56) References Cited

U.S. PATENT DOCUMENTS

| | | |
|---|---|---|
| 2005/0067101 A1 | 3/2005 | Funabashi |
| 2011/0042005 A1* | 2/2011 | Doni ................. H01L 21/31111 156/345.15 |
| 2012/0248061 A1* | 10/2012 | Brown .............. H01L 21/67253 216/12 |
| 2016/0093515 A1* | 3/2016 | Namba ............... H01L 21/6708 156/345.15 |
| 2017/0287726 A1* | 10/2017 | Bassett ............... H01L 21/6708 |

FOREIGN PATENT DOCUMENTS

| | | |
|---|---|---|
| KR | 10-0516345 B1 | 9/2005 |
| KR | 10-1320416 B1 | 10/2013 |
| KR | 10-1391605 B1 | 4/2014 |

\* cited by examiner

OPERATING METHOD FOR WET ETCHING SYSTEM AND RELATED SYSTEM

CROSS-REFERENCE TO RELATED APPLICATION

Korean Patent Application No. 10-2018-0166873, filed on Dec. 21, 2018, in the Korean Intellectual Property Office, and entitled: "Operating Method for Wet Etching System and Related System," is incorporated by reference herein in its entirety.

BACKGROUND

1. Field

Methods and systems consistent with example embodiments relate to a wet etching system operating method and its related system.

2. Description of the Related Art

An etching solution used in a wet etching process has an etching rate varying depending on concentration and temperature. A considerable process preparation period is required to raise the temperature of the etching solution and adjust the concentration of the etching solution. Various studies have been conducted to shorten the process preparation period.

SUMMARY

According to example embodiments, there is provided a wet etching system operating method which includes providing an etching apparatus having an $N^{th}$ etching solution. $N^{th}$ batch substrates are loaded into the etching apparatus, and an $N^{th}$ etching process is performed. Some of the $N^{th}$ etching solution is discharged, and the etching apparatus is refilled with an $(N+1)^{th}$ etching solution supplied from a supply apparatus connected to the etching apparatus. $(N+1)^{th}$ batch substrates are loaded into the etching apparatus, and an $(N+1)^{th}$ etching process is performed. The $(N+1)^{th}$ etching solution has a temperature within or higher than a temperature management range of the $(N+1)^{th}$ etching process. The $(N+1)^{th}$ etching solution has a concentration within or higher than a concentration management range of the $(N+1)^{th}$ etching process. Here, N is a positive integer.

According to example embodiments, there is provided a wet etching system operating method which includes discharging the entirety of a first etching solution included in an etching apparatus. A second etching solution is supplied from a supply apparatus connected to the etching apparatus. A substrate is loaded into the etching apparatus, and an etching process is performed. The temperature of the second etching solution supplied from the supply apparatus to the etching apparatus is within or higher than the temperature management range of the etching process. The concentration of the second etching solution supplied from the supply apparatus to the etching apparatus is within or higher than the concentration management range of the etching process.

According to example embodiments, there is provided a wet etching system operating method which includes providing an etching apparatus in which a substrate is loaded and an etching process is performed. An etching solution is supplied from a supply apparatus connected to the etching apparatus. The etching solution has a temperature within or higher than a temperature management range of the etching process. The etching solution has a concentration within or higher than a concentration management range of the etching process.

According to example embodiments, there is provided a wet etching system which includes an etching apparatus in which a substrate is loaded and an etching process is performed. A supply apparatus configured to supply an etching solution to the etching apparatus is provided. The etching apparatus includes an etching tank; a circulation line connected to the etching tank; an internal heater connected to the circulation line and configured to heat, in the etching tank, an etching solution circulated to the etching tank to a first temperature; and a discharge line connected to the etching tank. The supply apparatus includes a mixing tank and a preheater configured to heat the etching solution supplied from the mixing tank to the etching apparatus to a second temperature. The first temperature is within the temperature management range of the etching process. The second temperature is within or higher than the temperature management range of the etching process.

BRIEF DESCRIPTION OF THE DRAWINGS

Features will become apparent to those of skill in the art by describing in detail exemplary embodiments with reference to the attached drawings, in which.

DETAILED DESCRIPTION

A wet etching operating system, a semiconductor device forming method using the operating system, and its related system according to embodiments may apply to a pull-back process for semiconductor devices. e.g., a vertical NAND (VNAND) or three-dimensional (3D) flash memory. For example, the pull-back process for semiconductor devices may include using the wet etching operating system to remove a plurality of sacrificial layers among alternating oxide and sacrificial layers to form cavities for word lines.

Figure 1:
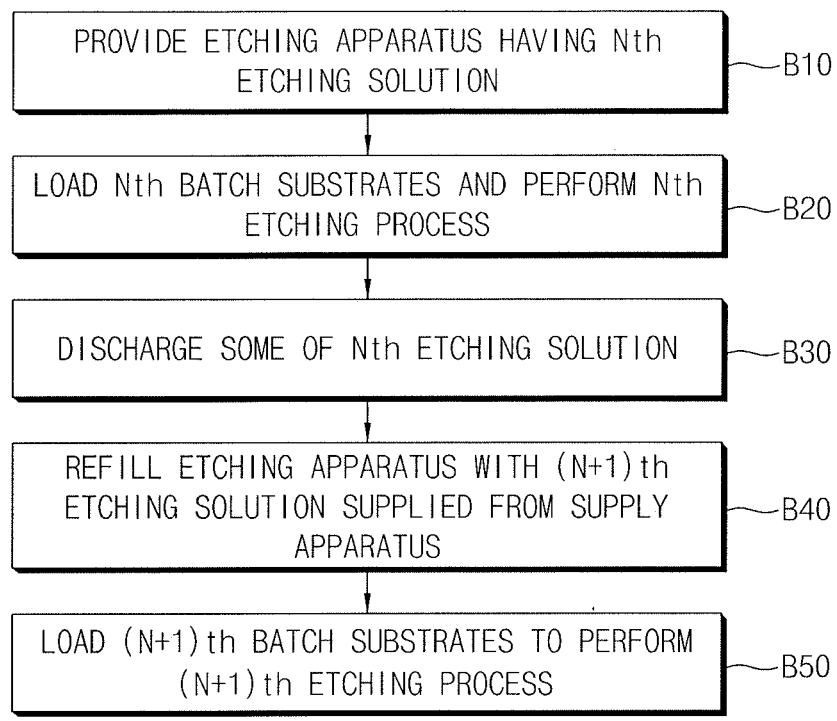
FIGS. 1 to 3 illustrate block diagrams of a wet etching system operating method according to an exemplary embodiment.
Figure 2:
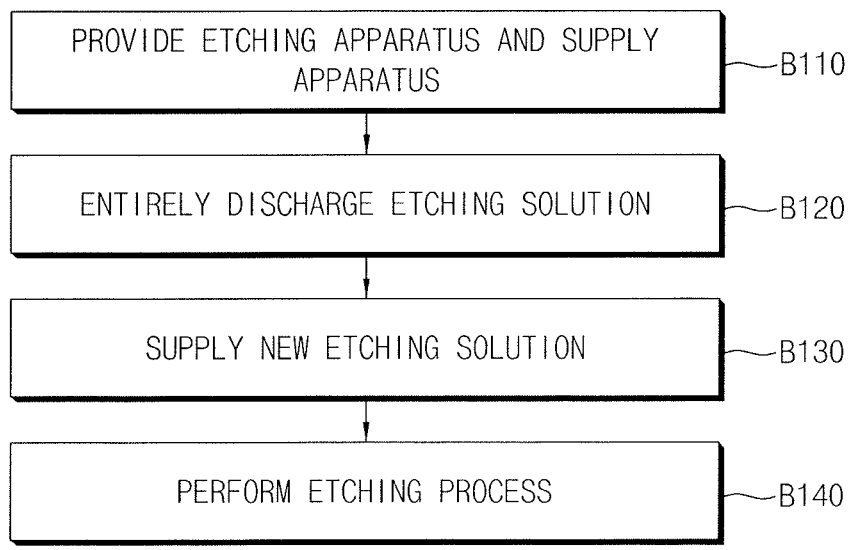
Figure 3:
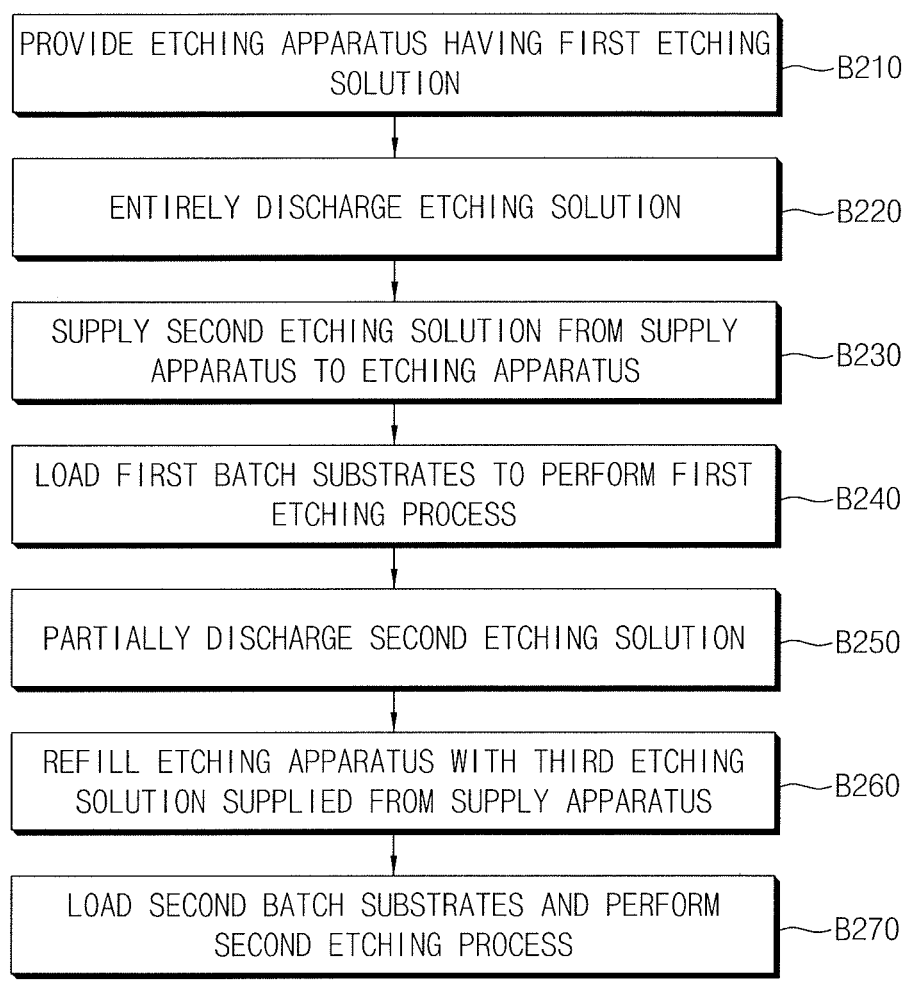

FIGS. 1 to 3 are block diagrams for describing a wet etching system operating method according to an exemplary embodiment.

Referring to FIG. 1, the wet etching system operating method according to the exemplary embodiment may include providing an etching apparatus having an $N^{th}$ etching solution (B10), loading $N^{th}$ batch substrates into the etching apparatus to perform an $N^{th}$ etching process (B20), discharging a portion of the $N^{th}$ etching solution (B30), refilling the etching apparatus with an $(N+1)^{th}$ etching solution supplied from a supply apparatus (B40), and loading $(N+1)^{th}$ batch substrates into the etching apparatus to perform an $(N+1)^{th}$ etching process (B50). Here, N is a positive integer, e.g., N and (N+1) may be sequential numbers 1 and 2 to indicate a numerical order.

For example, referring to FIG. 1, the wet etching system operating method may include providing an etching apparatus with a first etching solution, loading a first batch of substrates into the etching apparatus, and performing a first etching process on the first batch of substrates with the first etching solution. Once the first etching process is complete, a portion of the first etching solution may be discharged from the etching apparatus, and the etching apparatus may be refilled with a second etching solution supplied from a supply apparatus. A second batch of substrates may be loaded into the etching apparatus to perform a second etching process with the refilled etching solution. For example, as will be described in detail below, the second etching solutions may include a same chemical as the first etching solution, and process conditions during the first and second etching processes, e.g., etching solution temperature and concentration, may be the same. It is noted that the temperature and concentration of the etching solution within the etching apparatus, i.e., inside an etching tank, during an etching process may be referred to hereinafter as a temperature management range and a concentration management range of the etching process, respectively.

Referring to FIG. 2, a wet etching system operating method according to an exemplary embodiment may include providing an etching apparatus and a supply apparatus (B110), discharging the entirety of an etching solution from the etching apparatus (B120), supplying a new etching solution from the supply apparatus to the etching apparatus (B130), and loading a plurality of substrates into the etching apparatus to perform an etching process (B140).

Referring to FIG. 3, a wet etching system operating method according to an exemplary embodiment may include providing an etching apparatus having a first etching solution (B210), discharging the entirety of the first etching solution (B220), supplying a second etching solution from the supply apparatus to the etching apparatus (B230), loading first batch substrates into the etching apparatus to perform a first etching process (B240), discharging a portion of the second etching solution (B250), refilling the etching apparatus with a third etching solution supplied from the supply apparatus (B260), and loading second batch substrates into the etching apparatus to perform a second etching process (B270).

Figure 4:
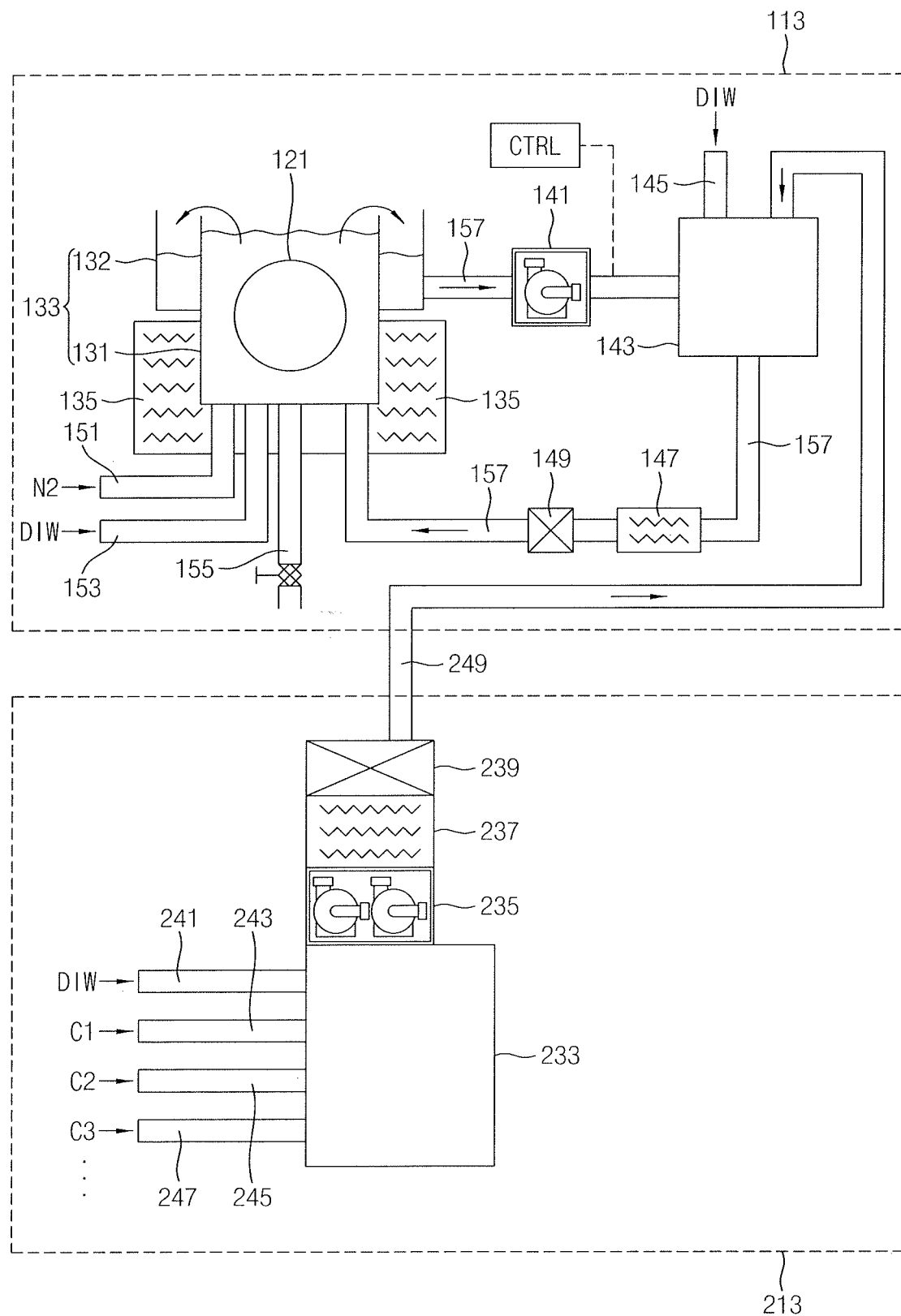
FIG. 4 illustrates a schematic view of a wet etching system according to an exemplary embodiment.
Figure 5:
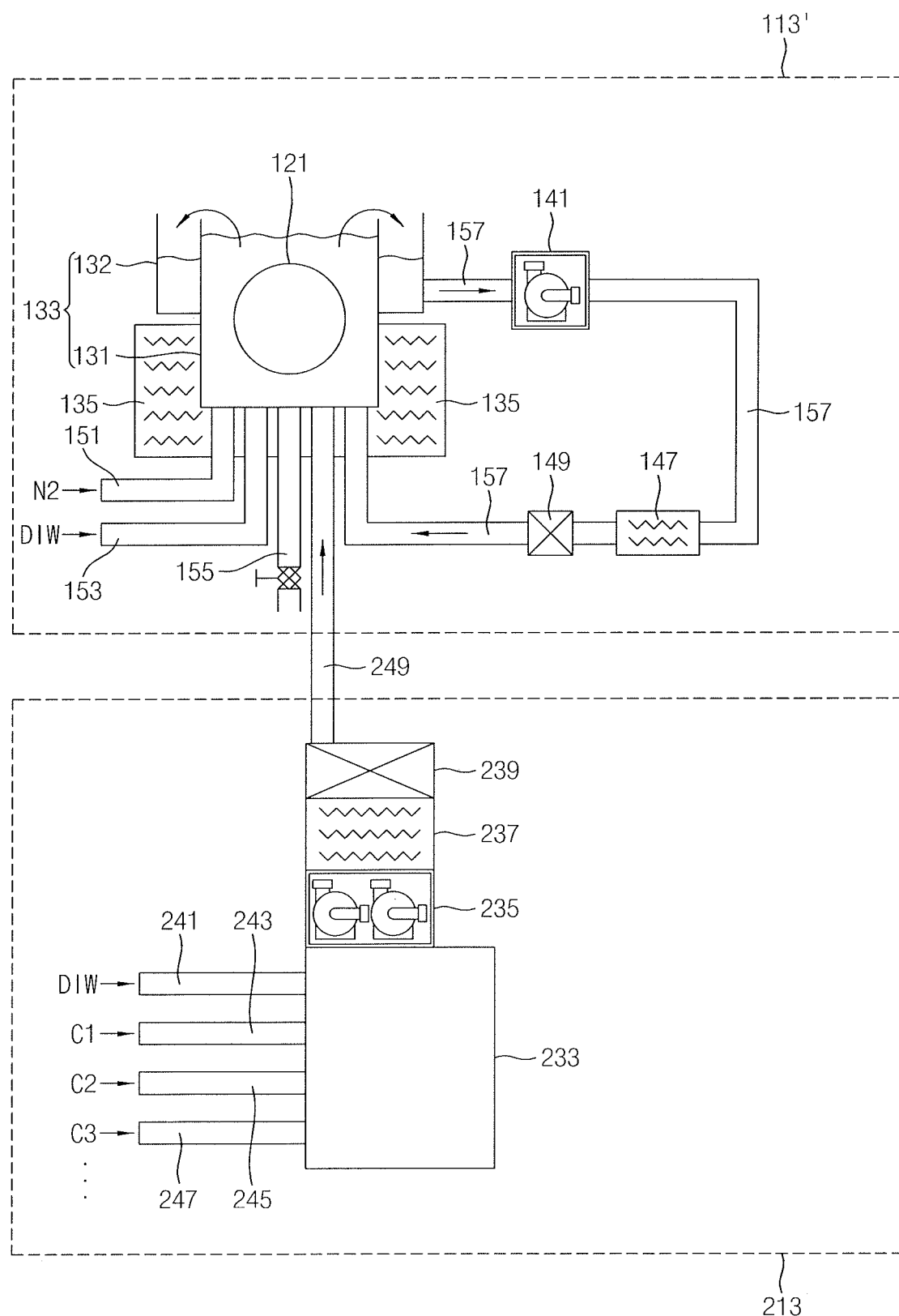
FIG. 5 illustrates a schematic view of a wet etching system according to an exemplary embodiment.

FIGS. 4 and 5 are schematic views for describing a wet etching system according to an exemplary embodiment.

Referring to FIG. 4, the wet etching system according to the exemplary embodiment may include an etching apparatus 113 and a supply apparatus 213 connected to the etching apparatus 113. The etching apparatus 113 may include an etching tank 133, a first internal heater 135, a circulation pump 141, an auxiliary tank 143, an auxiliary water supply line 145, a second internal heater 147, a circulation filter 149, a gas line 151, a water supply line 153, a discharge line 155, and a circulation line 157. The etching tank 133 may include an etching bath 131 and an outer bath 132. The supply apparatus 213 may include a mixing tank 233, a main pump 235, a preheater 237, a main filter 239, a main water supply line 241, one or more chemical inflow lines 243, 245, and 247, and a supply line 249.

An etching solution may be supplied into the etching bath 131. A substrate 121 may be loaded into the etching bath 131, and an etching process may be performed. The etching process may include immersing the substrate 121 in the etching solution included in the etching bath 131 for a predetermined time. The outer bath 132 may be disposed outside the etching bath 131, e.g., the outer bath 132 may surround a perimeter of the etching bath 131 at a top portion thereof. During the etching process, an etching solution overflowing the etching bath 131 may be collected in the outer bath 132. The etching bath 131 and the outer bath 132 may contain, e.g., may be formed of, a material that is chemically and physically resistant to the etching solution. In an exemplary embodiment, the etching bath 131 may include, e.g., may be formed of, quartz. The first internal heater 135 may be disposed adjacent to the etching bath 131. The first internal heater 135 may include an electric heating device. The first internal heater 135 may serve to heat the etching solution in the etching bath 131 within a processing temperature range.

The circulation line 157 may be connected to the outer bath 132 and the etching bath 131. The etching solution collected in the outer bath 132 may be circulated back into the etching bath 131 via the circulation line 157, the circulation pump 141, the auxiliary tank 143, the second internal heater 147, and the circulation filter 149. At least one circulation pump 141 may be disposed in various positions of the circulation line 157.

The auxiliary tank 143 may be disposed between the outer bath 132 and the second internal heater 147. The auxiliary water supply line 145 may be connected to the auxiliary tank 143. The auxiliary water supply line 145 may serve to supply water, e.g., deionized (DI) water, into the auxiliary tank 143. In an exemplary embodiment, the water supplied into the auxiliary tank 143 through the auxiliary water supply line 145 may be hot DI water. The auxiliary tank 143 may serve to adjust the concentration of the etching solution circulated through the circulation line 157. In the auxiliary tank 143, the etching solution supplied into the etching bath 131 through the circulation line 157, i.e., the etching solution collected from the outer bath 132 to be circulated back into the etching bath 131, may be diluted with water supplied through the auxiliary water supply line 145. In an exemplary embodiment, the auxiliary tank 143 and the auxiliary water supply line 145 may be omitted.

The second internal heater 147 may be disposed between the auxiliary tank 143 and the circulation filter 149. The second internal heater 147 may include an electric heating device. The second internal heater 147 may serve to heat the etching solution supplied into the etching bath 131 through the circulation line 157, e.g., the etching solution exiting the auxiliary tank 143 toward the etching bath 131, to a first temperature. The first temperature may be within a temperature management range of the etching process, e.g., the first temperature may be a desired temperature of the etching process I the etching bath 131. The circulation filter 149 may be disposed between the second internal heater 147 and the etching bath 131.

The gas line 151 may be connected to the etching bath 131. The gas line 151 may serve to supply an inert gas, e.g., nitrogen ($N_2$), into the etching solution in the etching bath 131. The water supply line 153 may be connected to the etching bath 131. The water supply line 153 may serve to supply water, e.g., DI water, into the etching bath 131. In an exemplary embodiment, the water supplied into the etching bath 131 through the water supply line 153 may be hot DI water. The water supply line 153 may serve to adjust the concentration, e.g., and temperature, of the etching solution in the etching bath 131. The etching solution in the etching bath 131 may be diluted with water supplied through the water supply line 153. The discharge line 155 may be connected to the etching bath 131. The etching solution in the etching apparatus 113 may be discharged to the outside via the discharge line 155.

The supply apparatus 213 may serve to supply the etching solution to the etching apparatus 113 through the supply line 249. In an exemplary embodiment, the supply line 249 may be connected to the auxiliary tank 143. The supply apparatus 213 may serve to supply the etching solution to the auxiliary tank 143 through the supply line 249.

The main water supply line 241 may be connected to the mixing tank 233. The main water supply line 241 may serve to supply water, e.g., DI water, into the mixing tank 233. In an exemplary embodiment, the water supplied into the mixing tank 233 through the main water supply line 241 may be hot DI water. The main water supply line 241 may serve to adjust the concentration, e.g., and temperature, of the etching solution in the mixing tank 233. The etching solution in the mixing tank 233 may be diluted, e.g., and warmed, with water supplied through the main water supply line 241.

Each of the chemical inflow lines 243, 245, and 247 may be connected to the mixing tank 233. Each of the chemical inflow lines 243, 245, and 247 may serve to supply, to the mixing tank 233, at least one chemical needed to compose the etching solution. In an exemplary embodiment, the main water supply line 241 may be omitted. The etching solution may be supplied to the mixing tank 233 through the chemical inflow lines 243, 245, and 247 after the etching solution is prepared outside the supply apparatus 213.

The main pump 235 may be disposed adjacent to the mixing tank 233. The main pump 235 may serve to supply the etching solution in the mixing tank 233 to the etching apparatus 113 through the supply line 249 via the preheater 237 and the main filter 239.

The preheater 237 may be disposed between the mixing tank 233 and the main filter 239. The preheater 237 may include an electric heating device. The preheater 237 may serve to heat the etching solution supplied from the mixing tank 233 to the etching apparatus 113 through the supply line 249 to a second temperature. The second temperature may be within or higher than a temperature management range of the etching process. In an exemplary embodiment, the preheater 237 may serve to heat the etching solution supplied from the mixing tank 233 to the etching apparatus 113 through the supply line 249 to a temperature higher than the median of the process temperature range, e.g., so the higher second temperature may be used to adjust the temperature in the etching tank 133 to the first temperature after a previous etching process. The main filter 239 may be disposed between the preheater 237 and the etching apparatus 113.

In an exemplary embodiment, the etching solution supplied from the mixing tank 233 to the etching apparatus 113 may include at least one chemical and water. The weight ratio (wt %) of the at least one chemical may be within or higher than a concentration management range of the etching process. In an exemplary embodiment, the weight ratio (wt %) of the at least one chemical may be higher than the median of the concentration management range of the etching process e.g., so the higher concentration may be used to adjust the concentration of the etching solution in the etching tank 133 after a previous etching process.

The at least one chemical may include phosphoric acid ($H_3PO_4$). The first temperature may range from about 160° C. to about 170° C., and the second temperature may range from about 160° C. to about 180° C., e.g., the second temperature may range from about 165° C. to about 180° C. In the etching process, the concentration management range of the phosphoric acid ($H_3PO_4$) in the etching tank 133 may range from about 88 wt % to about 95 wt %. In the etching solution supplied from the mixing tank 233 to the etching apparatus 113, the weight ratio (wt %) of the phosphoric acid ($H_3PO_4$) may range from about 88 wt % to about 98 wt %, e.g., the phosphoric acid ($H_3PO_4$) may range from about 92 wt % to about 98 wt %.

In an exemplary embodiment, the etching solution may include a high-selectivity nitrite etchant (HSN). The etching solution may include, e.g., phosphoric acid, an ammonium compound, a fluorine compound, water, or a combination thereof. In an exemplary embodiment, the etching solution may have a first etch rate with respect to silicon oxide and a second etch rate higher than the first etch rate with respect to silicon nitride. For example, with respect to the etching solution, the etching rate ratio of silicon nitride to silicon oxide may be about 200:1.

The silicon nitride etching mechanism of the etching solution may be represented by Chemical Formula 1 below:

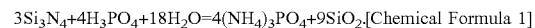

$$3Si_3N_4 + 4H_3PO_4 + 18H_2O = 4(NH_4)_3PO_4 + 9SiO_2. \quad \text{[Chemical Formula 1]}$$

The silicon oxide etching mechanism of the etching solution may be represented by Chemical Formula 2 below:

$$SiO_2 + 4H^+ + 4e^- + 2H_2O. \quad \text{[Chemical Formula 2]}$$

Referring to FIG. 5, a wet etching system according to an exemplary embodiment may include an etching apparatus 113' and the supply apparatus 213 connected to the etching apparatus 113. The etching apparatus 113' may include the etching tank 133, the first internal heater 135, the circulation pump 141, the second internal heater 147, the circulation filter 149, the gas line 151, the water supply line 153, the discharge line 155, and the circulation line 157. The etching tank 133 may include the etching bath 131 and the outer bath 132. The supply apparatus 213 may include the mixing tank 233, the main pump 235, the preheater 237, the main filter 239, the main water supply line 241, the one or more chemical inflow lines 243, 245, and 247, and the supply line 249. The supply line 249 may be connected to the etching bath 131. For example, as illustrated in FIG. 5, the supply line 249 may be connected directly to the etching tank 133, e.g., directly to the etching bath 131, as the etching apparatus 113' may not include an auxiliary tank. In an exemplary embodiment, the supply line 249 may be connected to the outer bath 132 and/or the circulation line 157.

Figure 6:
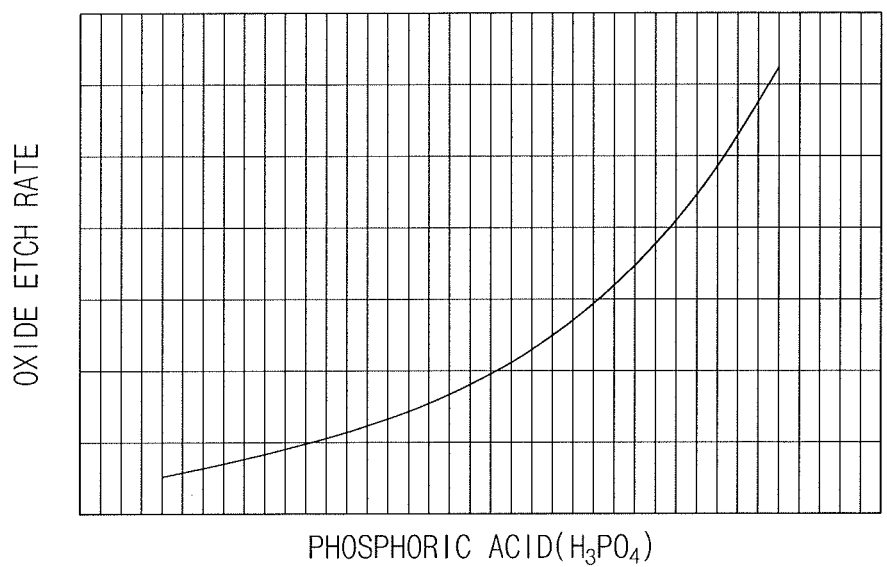
FIG. 6 illustrates a relational diagram of an oxide etch rate according to the concentration of phosphoric acid in an etching solution.

FIG. 6 is a relational diagram showing an oxide etch rate according to the concentration of phosphoric acid in an etching solution. In FIG. 6, a horizontal axis indicates the concentration of phosphoric acid ($H_3PO_4$) and is scaled in units of wt % or in arbitrary units (A.U.), and a vertical axis indicates an oxide etch rate and is scaled in A.U. Referring to FIG. 6, the oxide etch rate increases as the concentration of phosphoric acid ($H_3PO_4$) in the etching solution increases. With the wet etching system operating method according to the exemplary embodiment, it is possible to control the etch rates of silicon nitride and silicon oxide by adjusting the concentration of phosphoric acid ($H_3PO_4$) in the etching solution, e.g., controlling the temperature and concentration of the etching solution via a at least one controller CTRL (FIG. 4).

Figure 7:
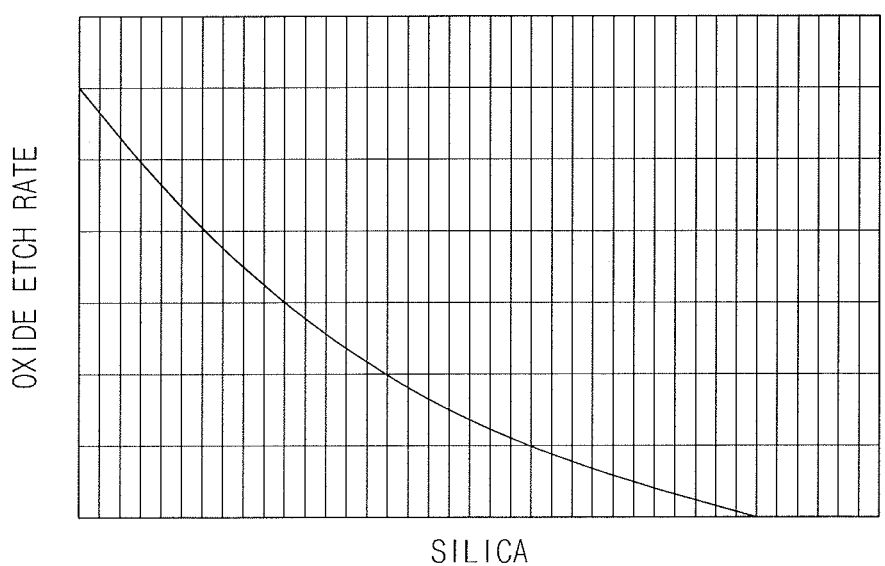
FIG. 7 illustrates a relational diagram showing an oxide etch rate according to the concentration of silica in an etching solution.

FIG. 7 is a relational diagram showing an oxide etch rate according to the concentration of silica in an etching solution. In FIG. 7, a horizontal axis indicates the concentration of silica and is scaled in units of ppm or in A.U., and a vertical axis indicates an oxide etch rate and is scaled in A.U. Referring to FIG. 7, the oxide etch rate may decrease as the concentration of silica in the etching solution increases.

Figure 8:
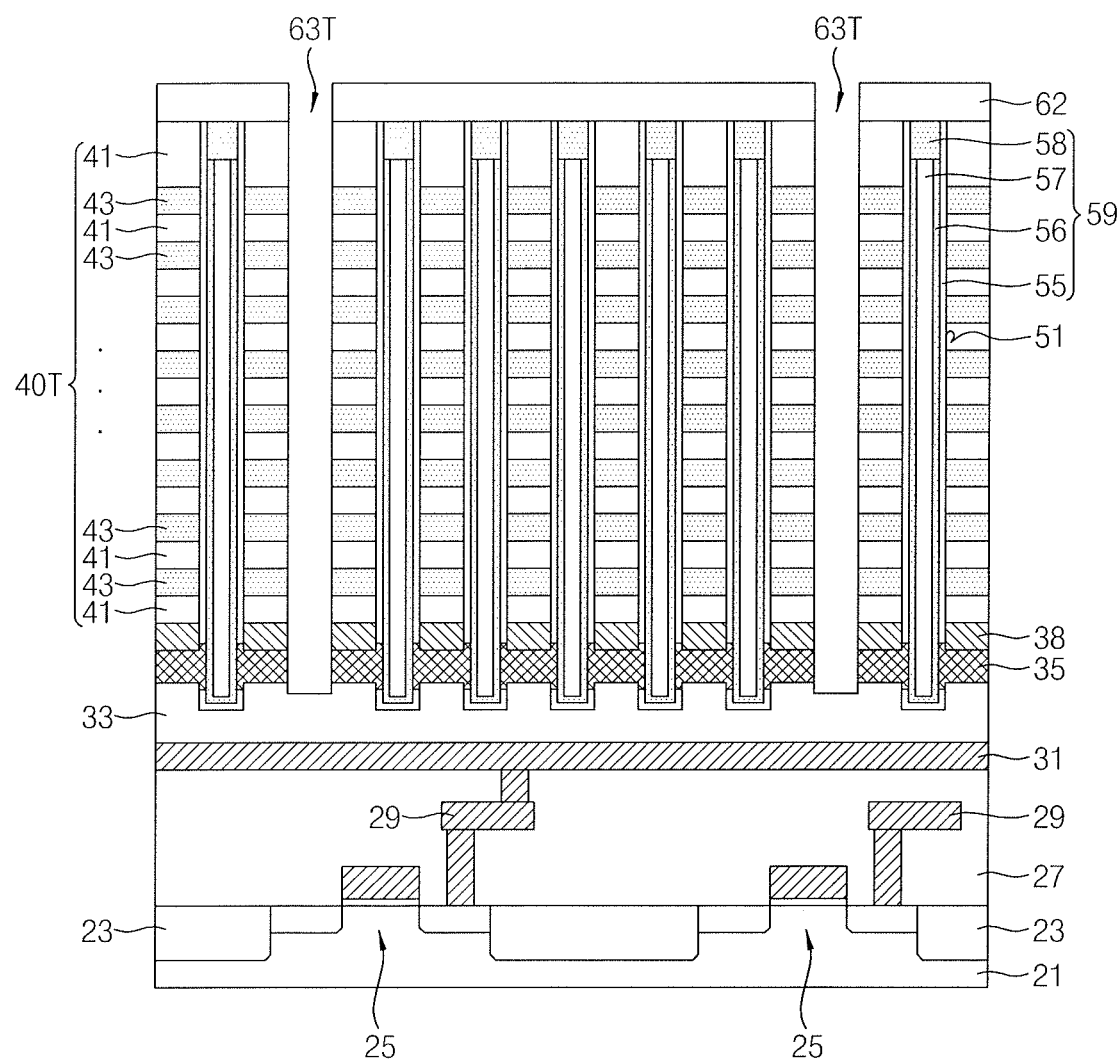
FIGS. 8 through 12 illustrate stages in a method of forming a semiconductor device according to an exemplary embodiment.
Figure 9:
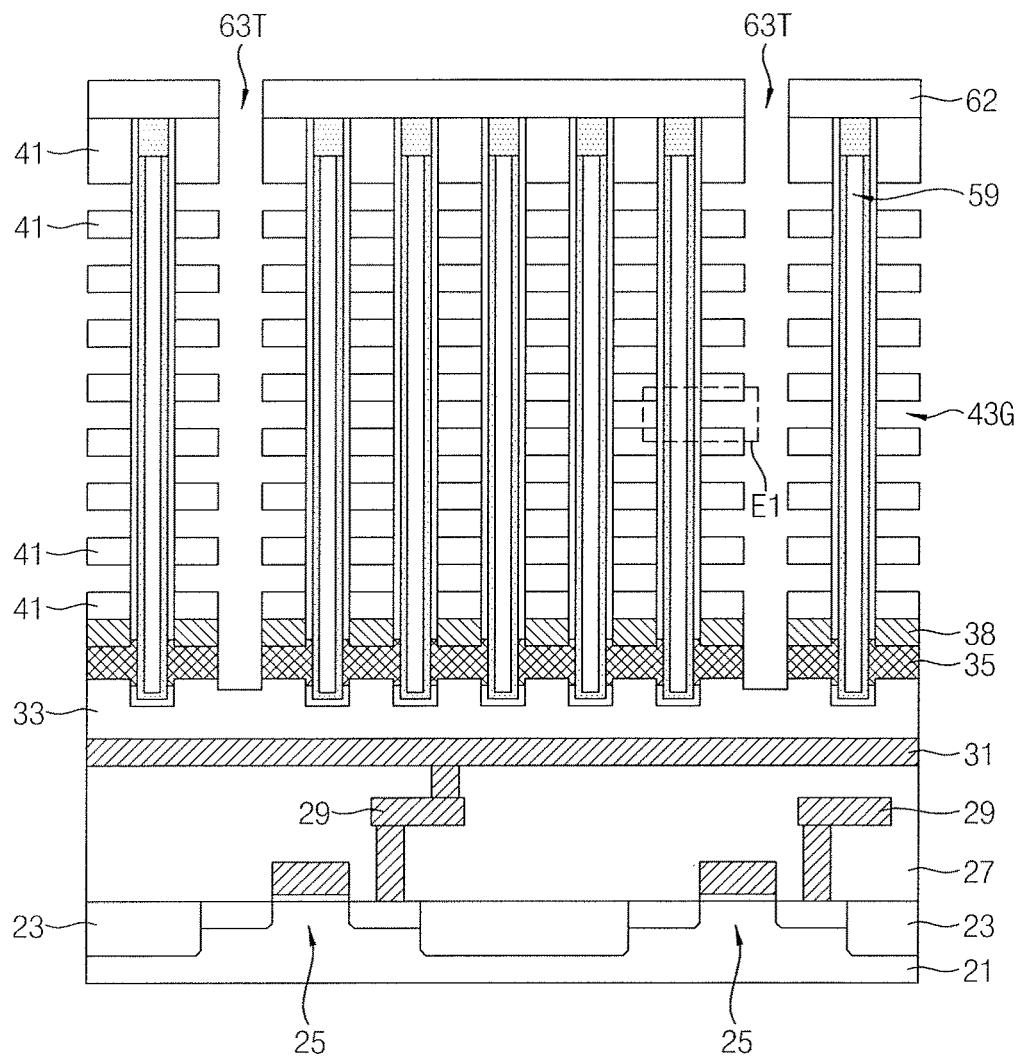
Figure 10:
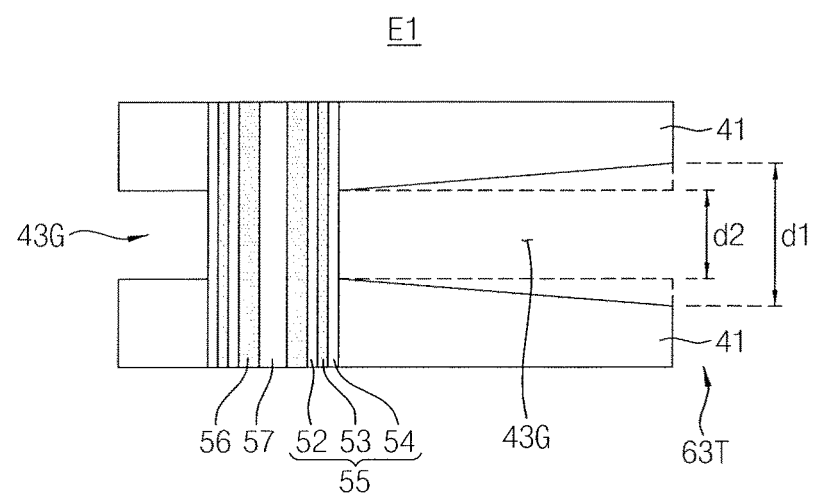
Figure 11:
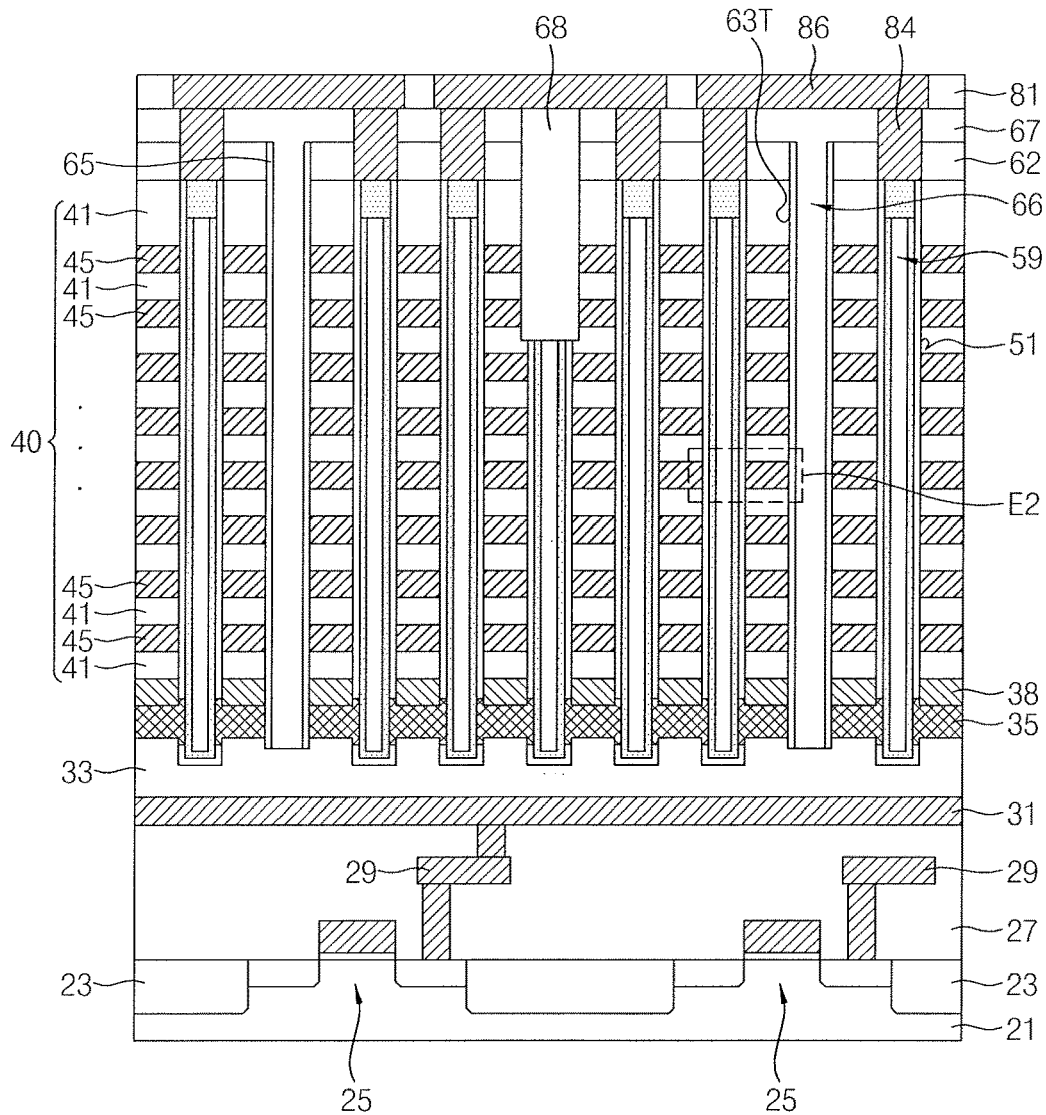
Figure 12:
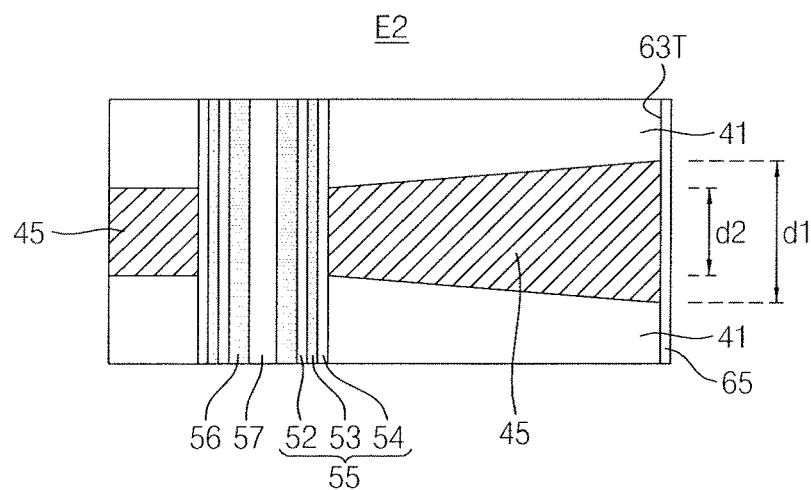

FIGS. 8 through 12 are views of stages in a method of forming a semiconductor device according to an exemplary embodiment. FIGS. 8, 9 and 11 are sectional views of stages in the method of forming the semiconductor device, FIG. 10 is an enlarged view of portion E1 in FIG. 9, and FIG. 12 is an enlarged view of portion E2 in FIG. 11.

The semiconductor device according to the exemplary embodiment may include a non-volatile memory, e.g., a VNAND or a 3D flash memory. The semiconductor device according to the exemplary embodiment may be interpreted as including a cell-on-peripheral (COP) structure.

Referring to FIG. 8, a first lower insulating layer 23, a plurality of transistors 25, a second lower insulating layer 27, a plurality of peripheral circuit interconnections 29, a lower buried conductive layer 31, an intermediate buried conductive layer 33, an alternative conductive line 35, and a support 38 may be formed on a substrate 21. A preliminary stacked structure 40T may be formed on the support 38. The preliminary stacked structure 40T may include a plurality of mold layers 41 and a plurality of sacrificial layers 43 which are alternately and repeatedly stacked on the substrate 21. A plurality of channel holes 51 may be formed in the intermediate buried conductive layer 33 by passing through the preliminary stacked structure 40T, the support 38, and the alternative conductive line 35. A plurality of channel structures 59 may be formed in the plurality of channel holes 51. Each of the channel structures 59 may include an information storage pattern 55, a channel pattern 56, a core pattern 57, and a bit pad 58.

A first upper insulating layer 62 may be formed on the preliminary stacked structure 40T and the plurality of channel structures 59. An isolation trench 63T may be formed to pass through the first upper insulating layer 62, the preliminary stacked structure 40T, the support 38, and the alternative conductive line 35. The intermediate buried conductive layer 33 may be exposed to the bottom of the isolation trench 63T. Side surfaces of the plurality of mold layers 41 and the plurality of sacrificial layers 43 may be exposed from a side wall of the isolation trench 63T.

The substrate 21 and the preliminary stacked structure 40T may correspond to a portion that is shown in a sectional view of the substrate 121 of FIG. 4. The substrate 21 may include a semiconductor substrate, e.g., a silicon wafer. The first lower insulating layer 23 may correspond to a device isolation layer. The first lower insulating layer 23 may include an insulating layer that is formed using shallow trench isolation (STI). The first lower insulating layer 23 may include, e.g., silicon oxide, silicon nitride, silicon oxynitride, a low-k dielectric, or a combination thereof. The plurality of transistors 25 may be formed inside and/or on the substrate 21 in various ways. The plurality of transistors 25 may include, e.g., a Fin Field-effect transistor (FinFET), a multi-bridge channel (MBC) transistor, a nanowire transistor, a vertical transistor, a recess channel transistor, a 3D transistor, a planar transistor, or a combination thereof.

The second lower insulating layer 27 may cover the first lower insulating layer 23 and the plurality of transistors 25. The plurality of peripheral circuit interconnections 29 may be formed in the first lower insulating layer 23. The plurality of peripheral circuit interconnections 29 may be connected to the plurality of transistors 25. The plurality of peripheral circuit interconnections 29 may include a horizontal interconnection and a vertical interconnection which have various shapes. The lower buried conductive layer 31 may be formed on the second lower insulating layer 27. The intermediate buried conductive layer 33 may be formed on the lower buried conductive layer 31.

The second lower insulating layer 27 may include, e.g., silicon oxide, silicon nitride, silicon oxynitride, a low-K dielectric, or a combination thereof. The lower buried conductive layer 31 may be electrically connected to the plurality of peripheral circuit interconnections 29. The plurality of peripheral circuit interconnections 29 and the lower buried conductive layer 31 may contain, e.g., a metal, a metal nitride, a metal oxide, a metal silicide, polysilicon, a conductive carbon, or a combination thereof. The intermediate buried conductive layer 33 may include a semiconductor layer containing, e.g., polysilicon doped with N-type impurities. The alternative conductive line 35 may include a semiconductor layer containing, e.g., polysilicon, a metal layer, a metal silicide layer, a metal oxide layer, a metal nitride layer, or a combination thereof. In an exemplary embodiment, the alternative conductive line 35 may include a polysilicon layer doped with N-type impurities. The alternative conductive line 35 may be brought into contact with the channel pattern 56 through the information storage pattern 55. The support 38 may contain polysilicon.

The plurality of sacrificial layers 43 may include a material with an etch selectivity with respect to the plurality of mold layers 41. In an exemplary embodiment, the plurality of sacrificial layers 43 may include a nitride, e.g., a silicon nitride, and the plurality of mold layers 41 may include an oxide, e.g., a silicon oxide. The core pattern 57 may include an insulating material, e.g., silicon oxide. The channel pattern 56 may include a semiconductor layer containing polysilicon. The channel pattern 56 may be doped with P-type impurities. The bit pad 58 may contain a semiconductor layer containing, e.g., polysilicon, a metal layer, a metal silicide layer, a metal oxide layer, a metal nitride layer, or a combination thereof. In an exemplary embodiment, the bit pad 58 may contain a polysilicon layer doped with N-type impurities. The bit pad 58 may be brought into contact with the channel pattern 56. The first upper insulating layer 62 may contain an insulating material, e.g., silicon oxide.

Referring to FIG. 9, by removing the plurality of sacrificial layers 43, a plurality of cavities 43G may be formed between the plurality of mold layers 41. The wet etching system and the wet etching system operating method, which have been described with reference to FIGS. 1 to 7, may be used to remove the plurality of sacrificial layers 43. For example, the removal of the plurality of sacrificial layers 43 may include performing the $(N+1)^{th}$ etching process of FIG. 1 (operation B50 in FIG. 1). An etching process for removing the plurality of sacrificial layers 43 may be referred to as a pull-back process.

Referring to FIG. 10, while the etching process for removing the plurality of sacrificial layers 43 is being performed, the plurality of sacrificial layers 43 may have a higher etch rate than the plurality of mold layers 41, e.g., so the material of the plurality of sacrificial layers 43 is removed faster than that of the mold layers 41. While the etching process for removing the plurality of sacrificial layers 43 is being performed, the plurality of mold layers 41 may be exposed to the etching solution earlier the closer the plurality of mold layers 41 are to the isolation trench 63T, e.g., portions of the plurality of mold layers 41 immediately adjacent to the isolation trench 63T may be exposed to the etching solution before other portions of the plurality of mold layers 41. While the etching process for removing the plurality of sacrificial layers 43 is being performed, the plurality of mold layers 41 may be exposed to the etching solution longer the closer the plurality of mold layers 41 are to the isolation trench 63T, e.g., portions of the plurality of mold layers 41 immediately adjacent to the isolation trench 63T may be exposed to the etching solution for a longer time than other portions of the plurality of mold layers 41. Each of the plurality of cavities 43G may have a greater height the closer a corresponding cavity is to the isolation trench 63T, e.g., portions of the cavities 43G immediately adjacent to the isolation trench 63T may have a greater height than other portions of the cavities 43G. Each of the plurality of cavities 43G may have a first height d1 at a first end, i.e., a part close (e.g., immediately adjacent) to the isolation trench 63T, and a second height d2 at a second end, i.e., a part far from the isolation trench 63T (i.e., opposite the first end and adjacent to the information storage pattern 55). The first height d1 may be greater than the second height d2.

The information storage pattern 55 may include a tunnel insulating layer 52, a charge storage layer 53, and a blocking layer 54. The tunnel insulating layer 52 may include an insulating layer containing, e.g., silicon oxide. The charge storage layer 53 may contain a material different from that of the tunnel insulating layer 52. The charge storage layer 53 may include an insulating layer containing, e.g., silicon oxide. The blocking layer 54 may contain a material different from that of the charge storage layer 53. The blocking layer 54 may include, e.g., an insulating layer containing silicon oxide, a metal oxide, or a combination thereof.

Referring to FIG. 11, a plurality of electrode layers 45 may be formed in the plurality of cavities 43G. An isolation spacer 65 may be formed on a side wall of the isolation trench 63T. An isolation insulating layer 66 filling the isolation trench 63T and a second upper insulating layer 67 covering the first upper insulating layer 62 may be formed. The plurality of mold layers 41 and the plurality of electrode layers 45 which are alternately and repeatedly stacked may compose a stacked structure 40. The plurality of electrode layers 45 may include a conductive layer containing, e.g., a metal, a metal silicide, a metal oxide, a metal nitride, polysilicon, a conductive carbon, or a combination thereof. Each of the isolation spacer 65, the isolation insulating layer 66, and the second upper insulating layer 67 may contain, e.g., silicon oxide, silicon nitride, silicon oxynitride, a low-k dielectric, or a combination thereof.

A selection line isolation pattern 68 that passes through the second upper insulating layer 67 and the first upper insulating layer 62 and passes through a portion of the stacked structure 40 may be formed. A plurality of bit plugs 84 that pass through the second upper insulating layer 67 and the first upper insulating layer 62 contact the bit pad 58 may be formed. A third upper insulating layer 81 and a plurality of bit lines 86 may be formed on the second upper insulating layer 67. The plurality of bit lines 86 may be brought into contact with the plurality of bit plugs 84. The selection line isolation pattern 68 and the third upper insulating layer 81 may include an insulating layer containing, e.g., silicon oxide, silicon nitride, silicon oxynitride, a low-K dielectric, or a combination thereof. Each of the plurality of bit plugs 84 and the plurality of bit lines 86 may include a conductive layer containing, e.g., a metal, a metal nitride, a metal oxide, a metal silicide, polysilicon, a conductive carbon, or a combination thereof.

In an exemplary embodiment, the alternative conductive line 35 may correspond to a source line or a common source line (CSL). The isolation trench 63T may correspond to a word line cut. Some of the plurality of electrode layers 45 may correspond to word lines. The lowermost layer among the plurality of electrode layers 45 may correspond to a gate-induced drain leakage (GIDL) control line. The second-lowest layer among the plurality of electrode layers 45 may correspond to a ground selection line GSL or a source selection line SSL. The uppermost layer among the plurality of electrode layers 45 may correspond to a GIDL control line. The second-highest layer among the plurality of electrode layers 45 may correspond to a string selection line SSL or a drain selection line DSL.

Referring to FIG. 12, each of the plurality of electrode layers 45 may have a greater height the closer the electrode layer is to the isolation trench 63T. Each of the plurality of electrode layers 45 may have a first height d1 at a part close to the isolation trench 63T and a second height d2 at a part far from the isolation trench 63T. The first height d1 may be greater than the second height d2.

Referring to FIGS. 1 and 4 to 12 again, the wet etching system operating method according to the exemplary embodiment may include providing the etching apparatus 113 having an $N^{th}$ etching solution (B10), e.g., a first etching solution. $N^{th}$ batch substrates may be loaded into the etching apparatus 113 and an $N^{th}$ etching process may be performed, e.g., a first batch of substrates may be etched in the etching apparatus 113 with the first etching solution via a first etching process. Some of the $N^{th}$ etching solution may be discharged through the discharge line 155 (B30), e.g., some of the fist etching solution may be discharged after the first etching process is complete. The amount of the $N^{th}$ etching solution discharged may be in the range of about 5% to about 50% of the $N^{th}$ etching solution. In an exemplary embodiment, the amount of the $N^{th}$ etching solution discharged may be approximately 30% of the $N^{th}$ etching solution.

The etching apparatus 113 may be refilled with an $(N+1)^{th}$ etching solution supplied from the supply apparatus 213 (B40), e.g., the etching apparatus 113 may be refilled with a second etching solution supplied from the supply apparatus 213. The amount of the $(N+1)^{th}$ etching solution supplied to refill the etching apparatus may be substantially equal to the amount of the $N^{th}$ etching solution discharged, e.g., the amount of the second etching solution supplied to refill the etching apparatus 113 may be substantially equal to the amount of the discharged first etching solution. $(N+1)^{th}$ batch substrates may be loaded into the etching apparatus 113 and an $(N+1)^{th}$ etching process may be performed (B50), e.g., a second batch of substrates may be loaded and etched using the etching solution (including the refilled second etching solution) in the etching apparatus 113. The temperature of the $(N+1)^{th}$ etching solution may be within or higher than a temperature management range of the $(N+1)^{th}$ etching process. The temperature of the $(N+1)^{th}$ etching solution supplied from the supply apparatus 213 to refill the etching apparatus 113 may be higher than a median of the temperature management range of the $(N+1)^{t1}$ etching process. The concentration of the $(N+1)^{th}$ etching solution may be within or higher than a concentration management range of the $(N+1)^{th}$ etching process. Each of the $N^{th}$ batch substrates and the $(N+1)^{th}$ batch substrates may include the substrate 121 (see FIG. 4) and/or the substrate 21 (see FIG. 8).

The $(N+1)^{th}$ etching solution supplied from the supply apparatus 213 to refill the etching apparatus 113 may contain at least one chemical and water, e.g., through the main water supply line 241 and at least one of the chemical inflow lines 243, 245, and 247. The weight ratio (wt %) of the at least one chemical may be within or higher than the concentration management range of the $(N+1)^{th}$ etching process. The weight ratio (wt %) of the at least one chemical may be higher than the median of the concentration management range of the $(N+1)^{th}$ etching process.

In an exemplary embodiment, the $N^{th}$ etching solution may contain the at least one chemical and water. The weight ratio (wt %) of the at least one chemical in the $(N+1)^{th}$ etching solution supplied from the supply apparatus 213 to refill the etching apparatus 113 may be higher than the weight ratio (wt %) of the at least one chemical in the $N^{th}$ etching solution.

The at least one chemical may include phosphoric acid ($H_3PO_4$). The temperature of the $(N+1)^{th}$ etching process in the etching tank 133 may range from about 160° C. to about 170° C. The temperature of the $(N+1)^{th}$ etching solution supplied from the supply apparatus 213 to refill the etching apparatus 113 may range from about 160° C. to about 180° C., e.g., from about 165° C. to about 180° C. In the etching process, the concentration management range of the phosphoric acid ($H_3PO_4$) in the etching tank 133 may range from about 88 wt % to about 95 wt % based on a total weight of the etching solution in the etching tank 133. In the $(N+1)^{th}$ etching solution supplied from the supply apparatus 213 to refill the etching apparatus 113, the weight ratio (wt %) of the phosphoric acid ($H_3PO_4$) may range from about 88 wt % to about 98 wt %, e.g., from about 92 wt % to about 98 wt %.

The water supplied to the etching bath 131 through the water supply line 153 may serve to adjust the temperature and concentration of the $N^{th}$ etching solution or the $(N+1)^{th}$ etching solution. The temperature of the $N^{th}$ etching solution or the $(N+1)^{th}$ etching solution may be lowered by the water supplied into the etching bath 131 through the water supply line 153. The $N^{th}$ etching solution or the $(N+1)^{th}$ etching solution may be diluted with the water supplied into the etching bath 131 through the water supply line 153. The method of lowering the temperature of the etching solution by adding water may require a shorter time than the method of raising the temperature of the etching solution. The method of diluting the concentration of the etching solution by adding water may require a shorter time than the method of increasing the concentration of the etching solution by evaporating water from the etching solution. According to the exemplary embodiment, it is possible to remarkably shorten a preparation period between one process and a subsequent process.

In the etching solution in the etching bath 131, the concentration of silica, i.e., silicon dioxide, may increase with the progress of the etching process according to the etching mechanism as shown in Chemical Formula 1, i.e., as silicon dioxide is a byproduct. As shown in FIG. 7, the etch rate of the plurality of mold layers 41 having silicon oxide may decrease due to an increase in the concentration of silica. As shown in FIG. 6, the etch rate of the plurality of mold layers 41 having silicon oxide may increase due to an increase in the weight ratio (wt %) of phosphoric acid ($H_3PO_4$). In an exemplary embodiment, the weight ratio (wt %) of phosphoric acid ($H_3PO_4$) in the $(N+1)^{th}$ etching solution supplied from the supply apparatus 213 to refill the etching apparatus 113 may be higher than the weight ratio (wt %) of phosphoric acid ($H_3PO_4$) in the $N^{th}$ etching solution. According to the exemplary embodiment, a decrease in the etch rate of the plurality of mold layers 41 due to the increase in concentration of silica may be compensated for by applying the increase in weight ratio (wt %) of phosphoric acid ($H_3PO_4$). According to the exemplary embodiment, it is possible to minimize the amount of etching solution consumed.

Referring to FIGS. 2 and 4 to 12 again, the wet etching system operating method according to the exemplary embodiment may include providing the etching apparatus 113 and the supply apparatus 213 (B110). The entirety of a first etching solution in the etching apparatus 113 may be discharged through the discharge line 155 (B120). A second etching solution may be supplied from the supply apparatus 213 to the etching apparatus 113 (B130).

A plurality of substrates may be loaded into the etching apparatus 113, and an etching process may be performed (B140). The plurality of substrates may include the substrate 121 (see FIG. 4) and/or the substrate 21 (see FIG. 8). In an exemplary embodiment, performing the etching process may include immersing the plurality of substrates in the second etching solution included in the etching tank 133. While the etching process is being performed, the second etching solution in the etching tank 133 may be circulated via the circulation line 157 and the second internal heater 147. The temperature of the second etching solution supplied from the supply apparatus 213 to the etching apparatus 113 may be within or higher than the temperature management range of the etching process. The concentration of the second etching solution supplied from the supply apparatus 213 to the etching apparatus 113 may be within or higher than the concentration management range of the etching process.

The second etching solution supplied from the supply apparatus 213 to the etching apparatus 113 may contain at least one chemical and water. The weight ratio (wt %) of the at least one chemical may be within or higher than the concentration management range of the etching process. The at least one chemical may include phosphoric acid ($H_3PO_4$). The temperature of the etching process may range from about 160° C. to about 170° C. The temperature of the second etching solution supplied from the supply apparatus 213 to the etching apparatus 113 may range from about 160° C. to about 180° C. In the etching process, the concentration management range of the phosphoric acid ($H_3PO_4$) may range from about 88 wt % to about 95 wt %. In the second etching solution supplied from the supply apparatus 213 to the etching apparatus 113, the weight ratio (wt %) of the phosphoric acid ($H_3PO_4$) may range from about 88 wt % to about 98 wt %.

Referring to FIGS. 3 to 12 again, the wet etching system operating method according to the exemplary embodiment may include providing the etching apparatus 113 having a first etching solution (B210). The entirety of the first etching solution in the etching apparatus 113 may be discharged through the discharge line 155 (B220). A second etching solution may be supplied from the supply apparatus 213 to the etching apparatus 113 (B230). First batch substrates may be loaded into the etching apparatus 113 and a first etching process may be performed (B240). The temperature of the second etching solution supplied from the supply apparatus 213 to the etching apparatus 113 may be within or higher than the temperature management range of the first etching process. The concentration of the second etching solution supplied from the supply apparatus 213 to the etching apparatus 113 may be within or higher than the concentration management range of the first etching process.

Some of the second etching solution in the etching apparatus 113 may be discharged through the discharge line 155 (B250). The amount of the second etching solution discharged may be in the range of about 5% to about 50% of the total second etching solution in the etching apparatus 113, e.g., about 30% of the second etching solution in the etching apparatus 113. The etching apparatus 113 may be refilled with a third etching solution supplied from the supply apparatus 213 (B260). The amount of the third etching solution supplied to refill the etching apparatus 113 may be substantially equal to the amount of the second etching solution discharged previously, i.e., in operation B250. Second batch substrates may be loaded into the etching apparatus 113 and a second etching process may be performed (B270).

The temperature of the third etching solution supplied from the supply apparatus 213 to the etching apparatus 113 may be within or higher than the temperature management range of the second etching process. The concentration of the third etching solution supplied from the supply apparatus 213 to the etching apparatus 113 may be within or higher than the concentration management range of the second etching process. In an exemplary embodiment, the concentration of the third etching solution supplied from the supply apparatus 213 to the etching apparatus 113 may be higher than the concentration of the second etching solution.

Each of the first batch substrates and the second batch substrates may include the substrate 121 (see FIG. 4) and/or the substrate 21 (see FIG. 8). Each of the first etching solution, the second etching solution, and the third etching solution may contain at least one chemical and water. The at least one chemical may include phosphoric acid ($H_3PO_4$).

Operation of the supply apparatus 213 and the etching apparatus 113 described above, e.g., with respect to controlling operation of supply flows/pipes, heaters, sensors determining temperatures and concentration, etc., may be performed by at least one controller via code or instructions to be executed by a computer, processor, manager, or controller. The computer, processor, controller, or other signal processing device may be those described herein or one in addition to the elements described herein. Any convenient algorithms that form the basis of the operations of the computer, processor, or controller may be used, and the code or instructions for implementing the operations of the embodiments may transform the computer, processor, controller, or other signal processing device into a special-purpose processor for performing the methods described herein.

Also, another embodiment may include a computer-readable medium, e.g., a non-transitory computer-readable medium, for storing the code or instructions described above. The computer-readable medium may be a volatile or non-volatile memory or other storage device, which may be removably or fixedly coupled to the computer, processor, or controller which is to execute the code or instructions for performing the method embodiments described herein.

By way of summation and review, example embodiments are directed to providing a wet etching system operating method advantageous for improving productivity, a semiconductor device forming method adapting the operating method, and its related system. That is, according to the exemplary embodiments, the temperature of the etching solution supplied from the supply apparatus to the etching apparatus can be within or higher than the temperature management range of the etching process, i.e., to adjust the temperature of the etching process to a desired temperature. The concentration of the etching solution supplied from the supply apparatus to the etching apparatus can be within or higher than the concentration management range of the etching process, i.e., to adjust the concentration of the etching solution to a desired concentration. Accordingly, it is possible to significantly shorten a preparation period of the etching process.

In other words, between one process and a subsequent process, some of the etching solution used in the etching apparatus can be discharged, and the etching apparatus can be refilled with a new etching solution. It is possible to remarkably shorten a preparation period between one process and a subsequent process, while minimizing the consumption amount of the etching solution, by adjusting the temperature and concentration of the etching solution in the etching apparatus via the temperature and concentration of the new etching solution refilling the etching apparatus. That is, the temperature and concentration of the new etching solution refilling the etching apparatus may be adjusted, before entering the etching apparatus, to be as close as possible to the conditions to be used in during the etching process. In addition, it is possible to realize a high oxide etch amount by controlling the high concentration of the phosphoric acid even in a region having a high silica concentration. Thus, it is possible to implement a wet etching system operating method that is advantageous for productivity improvement and a semiconductor device forming method and a related system adopting the same.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A wet etching system operating method, comprising:
providing an etching apparatus having an $N^{th}$ etching solution;
loading $N^{th}$ batch substrates into the etching apparatus and performing an $N^{th}$ etching process;
discharging some of the $N^{th}$ etching solution;
refilling the etching apparatus with an $(N+1)^{th}$ etching solution supplied from a supply apparatus connected to the etching apparatus; and
loading $(N+1)^{th}$ batch substrates into the etching apparatus and performing an $(N+1)^{th}$ etching process at a predetermined desired temperature and at a predetermined desired etchant concentration,
wherein the $(N+1)^{th}$ etching solution is separately heated to the predetermined desired temperature or higher, before refilling the etching apparatus with the $(N+1)^{th}$ etching solution, and
wherein a concentration of the $(N+1)^{th}$ etching solution is adjusted to the predetermined desired etchant concentration or higher, before refilling the etching apparatus with the $(N+1)^{th}$ etching solution, N being a positive integer.

2. The wet etching system operating method as claimed in claim 1, wherein:
an amount of the discharged $N^{th}$ etching solution is in a range of 5% to 50% of the $N^{th}$ etching solution; and
an amount of the $(N+1)^{th}$ etching solution supplied to refill the etching apparatus is substantially equal to the amount of the discharged $N^{th}$ etching solution.

3. The wet etching system operating method as claimed in claim 1, wherein the $(N+1)^{th}$ etching solution supplied from the supply apparatus to refill the etching apparatus has a temperature higher than the predetermined desired temperature of the $(N+1)^{th}$ etching process before refilling the etching apparatus.

4. The wet etching system operating method as claimed in claim 1, wherein the $(N+1)^{th}$ etching solution supplied from the supply apparatus to refill the etching apparatus contains at least one chemical and water, the at least one chemical and water being mixed together to the predetermined desired etchant concentration or higher before refilling the etching apparatus, and the at least one chemical having a weight ratio (wt %) within or higher than the predetermined desired etchant concentration.

5. The wet etching system operating method as claimed in claim 4, wherein the weight ratio (wt %) of the at least one chemical in the $(N+1)^{th}$ etching solution before refilling the etching apparatus is higher than the predetermined desired etchant concentration.

6. The wet etching system operating method as claimed in claim 4, wherein the weight ratio (wt %) of the at least one chemical in the $(N+1)^{th}$ etching solution supplied from the supply apparatus to refill the etching apparatus is higher than a weight ratio (wt %) of the at least one chemical in the $N^{th}$ etching solution.

7. The wet etching system operating method as claimed in claim 4, wherein:
the at least one chemical includes phosphoric acid ($H_3PO_4$), the phosphoric acid ($H_3PO_4$) and water being mixed together to the predetermined desired etchant concentration;
the predetermined desired temperature of the $(N+1)^{th}$ etching process is 160° C. to 170° C.; and
the $(N+1)^{th}$ etching solution supplied from the supply apparatus to refill the etching apparatus is heated to a temperature of 165° C. to 180° C. before refilling the etching apparatus, such that the temperature of the $(N+1)^{th}$ etching solution, before refilling the etching apparatus, is higher than the predetermined desired temperature of the $(N+1)^{th}$ etching process.

8. The wet etching system operating method as claimed in claim 7, wherein the $(N+1)^{th}$ etching solution is heated at least twice before refilling the etching apparatus.

9. The wet etching system operating method as claimed in claim 7, wherein:
the predetermined desired etchant concentration of the phosphoric acid ($H_3PO_4$) in the $(N+1)^{th}$ etching process ranges from 88 wt % to 95 wt %; and
the weight ratio (wt %) of the phosphoric acid ($H_3PO_4$) in the $(N+1)^{th}$ etching solution supplied from the supply apparatus to refill the etching apparatus ranges from 88 wt % to 98 wt %.

10. The wet etching system operating method as claimed in claim 9, wherein the weight ratio (wt %) of the phosphoric acid ($H_3PO_4$) in the $(N+1)^{th}$ etching solution supplied from the supply apparatus to refill the etching apparatus ranges from 92 wt % to 98 wt %, such that the weight ratio (wt %) of the phosphoric acid ($H_3PO_4$) in the $(N+1)^{th}$ etching solution supplied from the supply apparatus, before refilling the etching apparatus, is higher than the predetermined desired etchant concentration.

11. The wet etching system operating method as claimed in claim 9, wherein the weight ratio (wt %) of the phosphoric acid ($H_3PO_4$) in the $(N+1)^{th}$ etching solution supplied from the supply apparatus to refill the etching apparatus is higher than the weight ratio (wt %) of the phosphoric acid ($H_3PO_4$) in the $N^{th}$ etching solution.

12. The wet etching system operating method as claimed in claim 1, wherein the etching apparatus includes:
an etching tank;
a circulation line connected to the etching tank;
an internal heater connected to the circulation line, such that the $N^{th}$ and $(N+1)^{th}$ etching solutions circulate through the internal heater to heat to the predetermined desired temperature or higher before reaching the etching tank; and
a discharge line connected to the etching tank.

13. A method of forming a semiconductor device, the method comprising:
forming a stacked structure having a plurality of mold layers and a plurality of sacrificial layers alternately stacked on one surface of each of the $(N+1)^{th}$ batch substrates of claim 1;
forming a trench passing through the stacked structure and exposing side surfaces of the mold layers and the plurality of sacrificial layers to side walls of the trench;
removing the plurality of sacrificial layers to form a plurality of cavities between the plurality of mold layers by performing the $(N+1)^{th}$ etching process of claim 1; and
forming a plurality of electrode layers in the plurality of cavities.

14. The method of forming a semiconductor device as claimed in claim 13, wherein each of the plurality of cavities has an increasing height as a distance from the trenches decreases.

15. A wet etching system operating method, comprising:
discharging an entirety of a first etching solution from an etching apparatus;
supplying a second etching solution from a supply apparatus connected to the etching apparatus;
loading a substrate into the etching apparatus; and
performing an etching process on the substrate at a predetermined desired temperature and at a predetermined desired etchant concentration,
wherein the second etching solution supplied from the supply apparatus to the etching apparatus is separately heated to the predetermined desired temperature or higher, before being supplied to the etching apparatus, and
wherein a concentration of the second etching solution supplied from the supply apparatus to the etching apparatus is adjusted to the predetermined desired etchant concentration, before being supplied to the etching apparatus.

16. The wet etching system operating method as claimed in claim 15, wherein:
the etching apparatus includes:
an etching tank;
a circulation line connected to the etching tank; and
an internal heater connected to the circulation line, such that the second etching solution is heated by the internal heater to the predetermined desired temperature or higher before circulating back to the etching tank through the circulation line, and
loading the substrate into the etching apparatus and performing the etching process includes:
immersing the substrate in the second etching solution included in the etching tank; and
circulating, via the circulation line and the internal heater, the second etching solution included in the etching tank.

17. The wet etching system operating method as claimed in claim 15, wherein the second etching solution supplied from the supply apparatus to the etching apparatus contains at least one chemical and water, the at least one chemical having a weight ratio (wt %) within or higher than the predetermined desired etchant concentration.

18. The wet etching system operating method as claimed in claim 17, wherein:
the at least one chemical includes phosphoric acid ($H_3PO_4$)), the phosphoric acid ($H_3PO_4$) and water being mixed together to the predetermined desired etchant concentration before being supplied to the etching apparatus;
the predetermined desired temperature of the etching process is 160° C. to 170° C.; and
the second etching solution supplied from the supply apparatus to the etching apparatus is heated to a temperature of 165° C. to 180° C., before refilling the etching apparatus, such that the temperature of the second etching solution is higher than the predetermined desired temperature of the etching process.

19. The wet etching system operating method as claimed in claim 18, wherein:
the phosphoric acid ($H_3PO_4$) in the etching process has a predetermined desired etchant concentration of 88 wt % to 95 wt %; and
the phosphoric acid ($H_3PO_4$) in the second etching solution supplied from the supply apparatus to the etching apparatus has a weight ratio (wt %) of 88 wt % to 98 wt %.

20. A wet etching system operating method, comprising:
providing an etching apparatus in which a substrate is loaded and an etching process is performed at a predetermined desired temperature and at a predetermined desired etchant concentration; and
supplying an etching solution from a supply apparatus connected to the etching apparatus,
wherein the etching solution is separately heated to the predetermined desired temperature or higher, before being supplied to the etching apparatus, and
wherein a concentration of the etching solution is adjusted to the predetermined desired etchant concentration or higher before being supplied to the etching apparatus.

* * * * *